United States Patent [19]

Chesebro et al.

[11] Patent Number: 5,636,133

[45] Date of Patent: Jun. 3, 1997

[54] EFFICIENT GENERATION OF FILL SHAPES FOR CHIPS AND PACKAGES

[75] Inventors: Donald G. Chesebro, Colchester, Vt.; Young O. Kim, Santa Clara County, Calif.; Mark A. Lavin, Westchester County, N.Y.; Daniel N. Maynard, Orleans County, Vt.

[73] Assignee: International Business Machines Corporation, Armonk, N.Y.

[21] Appl. No.: 445,447

[22] Filed: May 19, 1995

[51] Int. Cl.⁶ .................................................. G06F 17/50
[52] U.S. Cl. .......................... 364/491; 364/490; 395/133; 395/141; 345/112
[58] Field of Search ............................ 364/490, 491; 395/135, 141, 160, 921, 133

[56] References Cited

U.S. PATENT DOCUMENTS

| | | | |
|---|---|---|---|
| 4,789,944 | 12/1988 | Wada et al. | 364/488 |
| 4,809,201 | 2/1989 | Keklak | 364/518 |
| 5,062,054 | 10/1991 | Kawakami et al. | 364/491 |
| 5,278,105 | 1/1994 | Eden et al. | 437/250 |
| 5,319,570 | 6/1994 | Davidson et al. | 364/488 |
| 5,481,473 | 1/1996 | Kim et al. | 364/490 |
| 5,519,628 | 5/1996 | Russell et al. | 364/489 |
| 5,528,508 | 6/1996 | Russell et al. | 364/488 |

*Primary Examiner*—Kevin J. Teska
*Assistant Examiner*—Thai Phan
*Attorney, Agent, or Firm*—Whitham, Curtis, Whitham & McGinn; Stephen C. Kaufman

[57] ABSTRACT

An efficient method for modifying a chip or package design allows for the creation of small shapes without excessive expansion of design data. A computer program takes a physical design, represented in a computer data file, and generates a modified version of the design in which fill shapes have been added. Subsequently, when the modified design is processed, the resulting semiconductor chip or package will contain physical images of the added fill shapes, with the effect of making local pattern density more uniform and hence reducing process-induced variations in feature size and shape.

6 Claims, 9 Drawing Sheets c = boundary of unit cell
X = grid points not occupied by unit cells
* = grid points occupied by unit cells

EFFICIENT GENERATION OF FILL SHAPES FOR CHIPS AND PACKAGES

CROSS-REFERENCE TO RELATED APPLICATIONS

The subject matter of this application is related to application Ser. No. 08/019,971 for "System and Method for Verifying a Hierarichical Circuit Design" by P. J. Russell and G. S. Weinert, now U.S. Pat. No. 5,528,508 application Ser. No. 08/019,927 for "System and Method for Formulating Subsets of a Hierarachical Circuit" by P. J. Russell and G. S. Weinert, now U.S. Pat. No. 5,519,628, application Ser. No. 08/019,924 for "Application Generator for Use in Verifying a Hierarchical Circuit Design" by P. J. Russell and G. S. Weinert, and application Ser. No. 08/019,970 for "System and Method for Building Interconnections in a Hierarchical Circuit Design" by Y. O. Kim, P. J. Russell and G. S. Weinert, now U.S. Pat. No. 5,481,473 all filed on Feb. 19, 1993, and assigned to a common assignee with this application. The subject matter of this application is also related to application Ser. No. 08/445,436 for "Nested Maximum Space Computation and Efficient Generation of Nested Shape Complementation" by Y. O. Kim and application Ser. No. 08/444,471 for "Efficient Generation of Negative Fill Shapes for Chips and Packages" by M. A. Lavin and L. W. Liebmann, both filed concurrently herewith and assigned to a common assignee with this application. The foregoing applications are incorporated herein by reference.

BACKGROUND OF THE INVENTION

1. Field of the Invention

The present invention generally relates to the design of semiconductor integrated circuits (ICs) or of electronic packages and, more particularly, to an efficient procedure for modifying the design to allow the creation of fill shapes which are added to the design to correct for process deviations.

2. Description of the Prior Art

Semiconductor integrated circuits (ICs) and printed circuit packages typically are composed of structures consisting of several layers of conducting, insulating and other materials that are structured in the horizontal dimension by fabrication processes that transfer patterns defined in physical designs or layouts. The physical designs are represented by computer data representing two-dimensional shapes. The computer data are organized in a hierarchical data structure that exploits the repetitive structure usually found in circuits and packages.

In some cases, the action of the fabrication processes is affected by the design patterns being transferred to the physical materials. For example, the local pattern density of the design, i.e., the fraction of area over which material is deposited (or removed) can affect the shapes and dimensions of features, with the "locality extent" dependent on the specific fabrication process. As a specific example, this can occur in reactive ion etching (RIE), in which a deficiency in local pattern density (meaning that more material is to be etched away) causes the pattern features to be too large (i.e., "underetched") due to depletion of the etchants. This effect appears to act at a length scale of hundreds of micrometers to millimeters. Other processes that may be affected by local pattern density include lithographic patterning of resist materials and chemical-mechanical (so called "chemech" ) polishing.

There are a variety of approaches to solving this problem, some of which pertain to the fabrication process itself, while others work by modifying the physical design to mitigate the pattern-dependent effects. The approach of the latter type solution is to reduce deviations from design to fabricated part by adding fill shapes that have no electrical function but which reduce variations in local pattern density. There are several drawbacks to this approach including the possibility that fill shapes may affect electrical behavior/performance, fill shapes are difficult to add to the design manually and may be computationally costly to generate automatically, and fill shapes may significantly increase data size of the physical design, making subsequent data-handling steps (e.g., mask fracturing) more difficult.

U.S. Pat. No. 5,278,105 to Eden et al. describes the use of fill shapes for correcting process problems due to local pattern density deficiencies; however, there is no description of the method of generating those fill shapes. Without an efficient method for generating the fill shapes, the Eden et al. method is potentially very expensive to implement.

SUMMARY OF THE INVENTION

It is therefore an object of the present invention to provide an efficient method for modifying a chip or package design to allow for the creation of fill shapes without excessive computation or expansion of design data.

According to the invention, there is provided a computer-implemented system that takes a physical design, represented in a computer data file, and generates a modified version of the design in which fill shapes have been added. Subsequently, when the modified design is processed, the resulting semiconductor chip or package will contain physical images of the added fill shapes, with the effect of making local pattern density more uniform and hence reducing process-induced variations in feature size and shape.

In a preferred embodiment of the invention, for each level of the original design as represented in an input data file, an area-not-to-fill is generated as a function of set backs from features of the original design. Then an areas-not-to-fill is computed as a union of the generated area-not-to-fill for all levels of the design. The computed areas-not-to-fill is complemented to produce an areas-to-fill. Those portions of the areas-to-fill that are narrower than a fill pattern unit cell are eliminated, and the remaining areas-to-fill are broken into rectangles, quadrilaterals and triangles. These geometric shapes are then populated with a fill pattern comprised of multiple placements of the fill pattern unit cell. The generated fill shapes are combined with the original design to complete the process.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

The invention may be implemented on a variety of hardware platforms, including personal computers (PCs), workstations, mini-computers, and mainframe computers. Many of the steps of the method according to the invention may be advantageously implemented on parallel processors of various types. Parallel processing is common in mainframe computers and increasingly more common in mini-computers and workstations. Therefore, by way of example and not limitation, there is first described a representative hardware environment on which the invention may be implemented.

Figure 1:
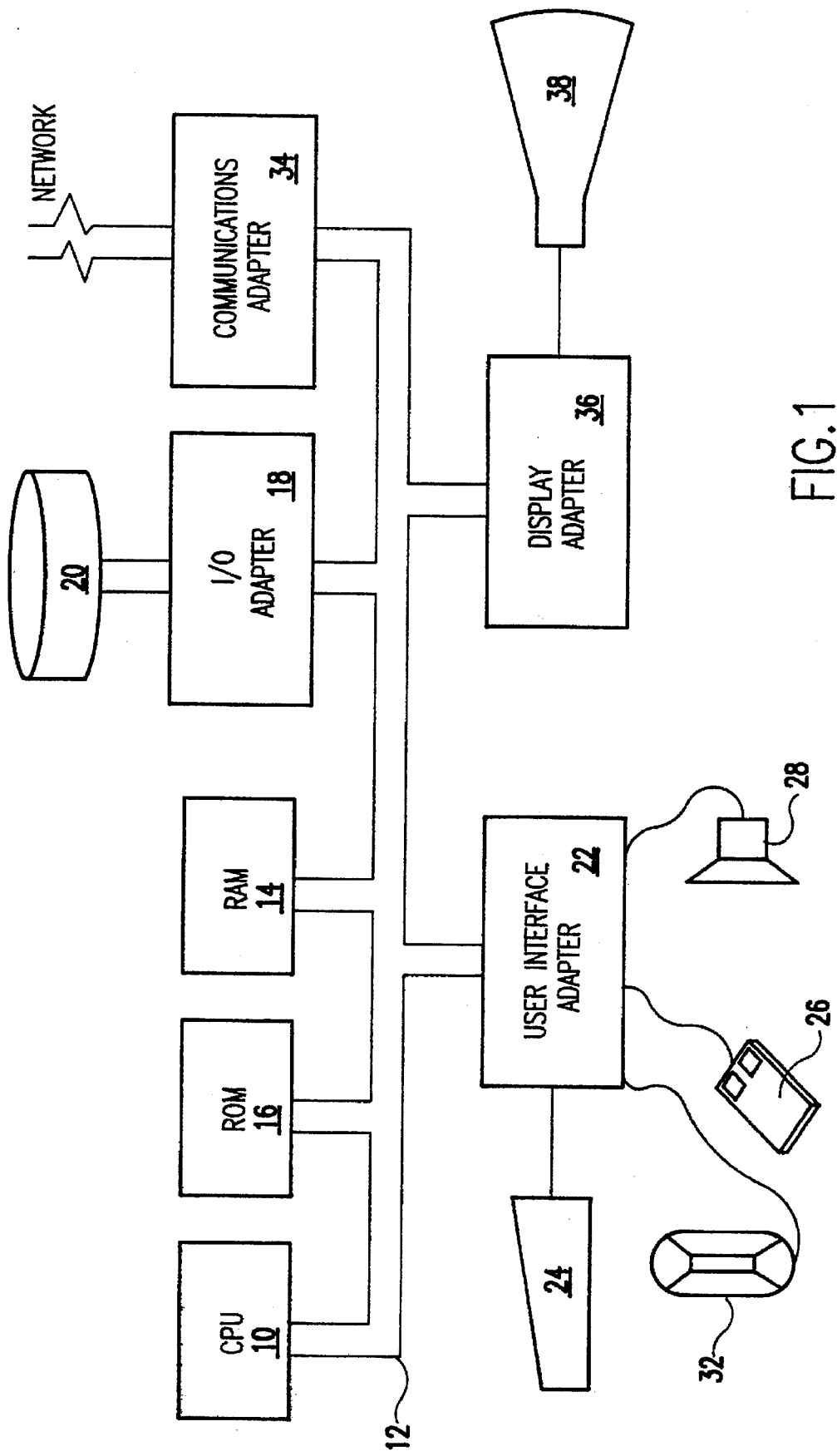
FIG. 1 is a block diagram showing a hardware configuration on which the subject invention may be implemented.

Referring now to the drawings, and more particularly to FIG. 1, there is shown a representative hardware environment which may be a personal computer, such as the International Business Machines (IBM) Corporation's PS/2 family of Personal Computers, or a workstation, such as IBM's RS/6000 Workstation. The hardware includes a central processing unit (CPU) 10, which may conform to Intel's X86 architecture or may be a reduced instruction set computer (RISC) microprocessor such as IBM's PowerPC® microprocessor. The CPU 10 is attached to a system bus 12 to which are attached a read/write or random access memory (RAM) 14, a read only memory (ROM) 16, an input/output (I/O) adapter 18, and a user interface adapter 22. The RAM 14 provides temporary storage for application program code and date, while ROM 16 typically includes the basic input/output system (BIOS) code. The I/O adapter 18 is connected to one or more Direct Access Storage Devices (DASDs), here represented as a disk drive 20. The disk drive 20 typically stores the computer's operating system (OS) and various application programs, each of which are selectively loaded into RAM 14 via the system bus 12. The user interface adapter 22 has attached to it a keyboard 24, a mouse 26, a speaker 28, a microphone 32, and/or other user interface devices (not shown). The personal computer or workstation also includes a display 38, here represented as a cathode ray tube (CRT) display but which may be a liquid crystal display (LCD) or other suitable display. The display 38 is connected to the system bus 12 via a display adapter 34. Optionally, a communications adapter 34 is connected to the bus 12 and to a network, for example a local area network (LAN), such as IBM's Token Ring LAN. Alternatively, the communications adapter may be a modem connecting the personal computer or workstation to a telephone line as part of a wide area network (WAN).

The preferred embodiment of the invention is implemented on a hardware platform such as that generally shown in FIG. 1 or, as mentioned above, on a mini-computer or mainframe computer. The process according to the invention will now be described by way of flow diagrams and a specific example.

Figure 2:
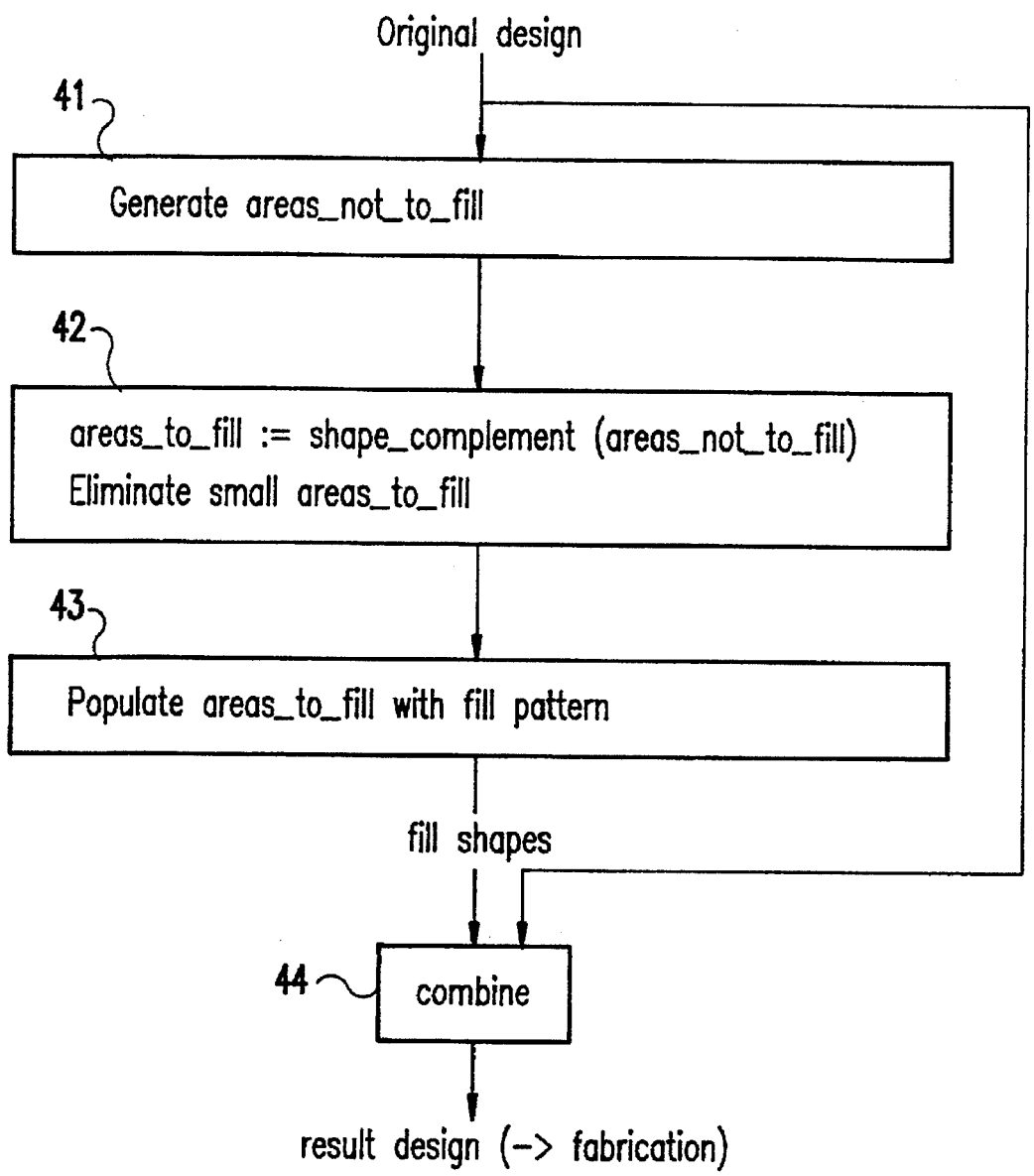
FIG. 2 is a top level flow diagram of the computer program that takes a physical design represented in a computer data file and generates a modified version of the design according to the invention.

FIG. 2 shows the top level flow diagram of the computer program according to a preferred embodiment of the invention. The first step 41 in the generation of fill shapes in the physical design of a semiconductor circuit or packages is to generate "areas-not-to-fill". The second step 42 is to compute the shape complement of those areas; that is, the "areas-to-fill". As part of this step, small areas-to-fill are eliminated. The third step 43 is to populate the areas-to-fill with fill shapes of a specified pattern. The result of step 43 are fill shapes which are then combined in function block 44 with the original pattern to produce the resulting design used in the fabrication of the IC.

Each of the steps shown in FIG. 2 is described in more detail below. The invention is described by way of a specific example that pertains to the addition of fill shapes corresponding to the polysilicon features of a semiconductor circuit, but it will be understood by those skilled in the art that the procedure described can be modified to add fill shapes on other material layers.

Figure 3:
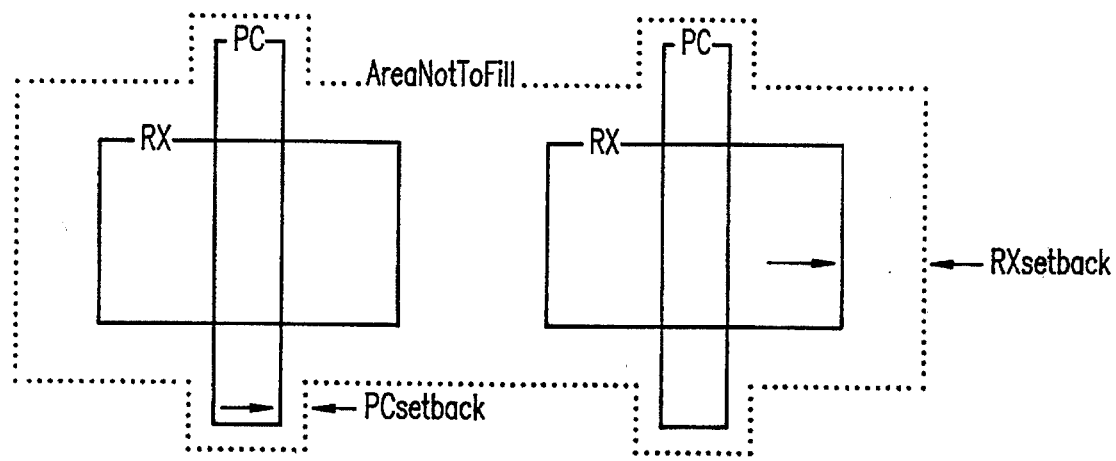
FIG. 3 is a geometric illustration of the results of the computation of the area-not-to-fill.

In generating fill shapes for the polysilicon level (i.e., the set of shapes that pattern the polysilicon lines on a chip), we want to put those shapes in the spaces between the polysilicon shapes that the designer "drew". To avoid violating process and electrical ground rules, the "area-to-fill" should be set back from the drawn polysilicon shapes. In addition, to satisfy other ground rules, the area-to-fill should be set back from shapes on other levels (e.g., diffusion) and other areas specified by the designer (e.g., test structures) should be avoided. An example is illustrated in FIG. 3 showing the polysilicon (PC) setback and the diffusion (RX) setback as defining an area-not-to-fill. It is convenient to define an "area-not-to-fill" as the union of the shapes on the polysilicon (PC) and diffusion (RX) levels, for example, each expanded by the appropriate set-back amount.

Figure 4:
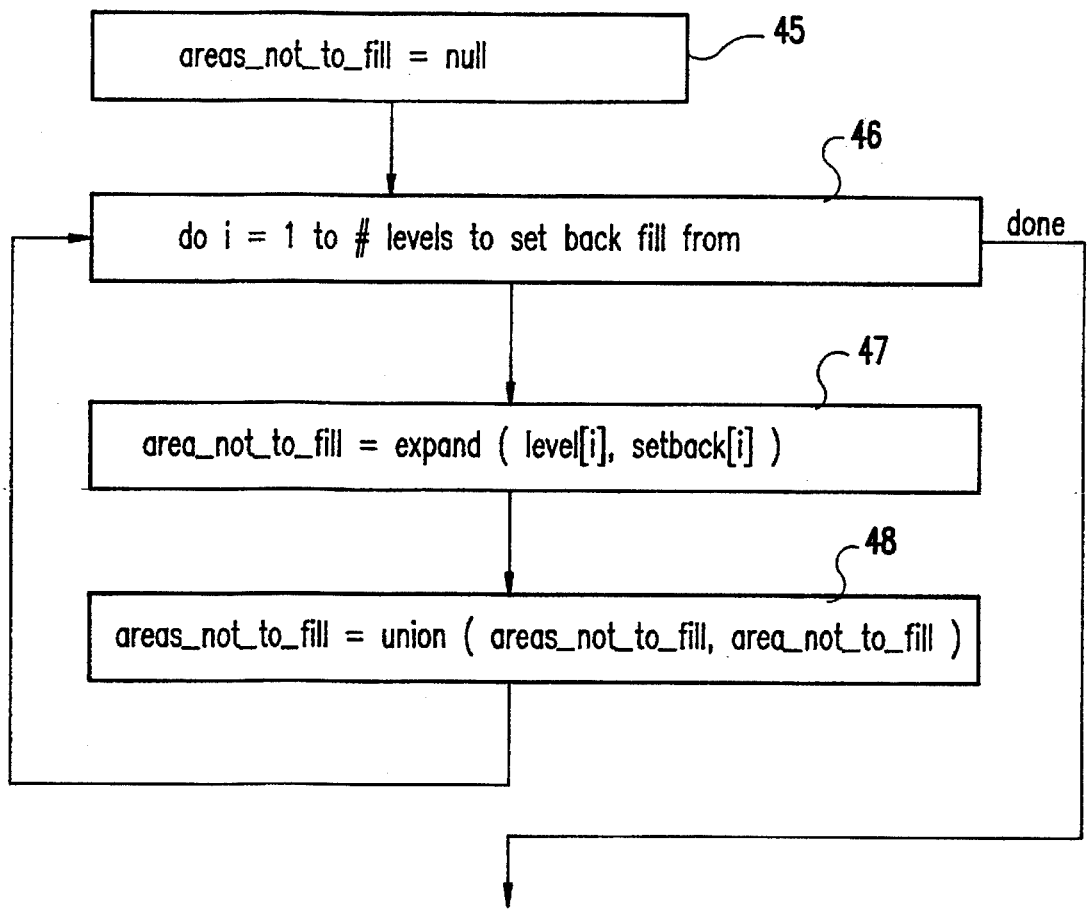
FIG. 4 is a flow diagram illustrating the logic of the process of generating areas-not-to-fill.

The program to do this is illustrated by the flow diagram shown in FIG. 4. The process begins by resetting the areas_not_to_fill in function block 45. Then a loop is entered at function block 46 for the computation of the set backs for each of the levels in the integrated circuit (IC) design. This is accomplished by first expanding the area_not_to_fill according to the set backs for the first level in function block 47. Since this is the first level, the process loops back to function block 46 and then, in function block 47, the area_not_to_fill for the second level is expanded. This time through the loop, the areas_not_to_fill are computed in function block 48 as the union of the two areas_not_to_fill for the first and second levels. The process continues until all levels have been processed.

In the preferred implementation, the expand operation in function block 47 and the union operation in function block 48 are performed using the Shape Instance Method taught in applications Ser. No. 08/019,971, Ser. No. 08/019,927, Ser. No. 08/019,924 for "Application Generator for Use in Verifying a Hierarchical Circuit Design" by P. J. Russell and G. S. Weinert, and application Ser. No. 08/019,970, referenced above. The Shape Instance Method has the effect of reducing computation time and maintaining the compact hierarchical structure of the partial result produced from the process in FIG. 4. The use of the Shape Instance Method is, however, not essential to the overall operation of the present application and could be replaced by a non-nested (i.e., "flat") implementation readily available in many very large scale integration (VLSI) design manipulation systems.

Figure 5:
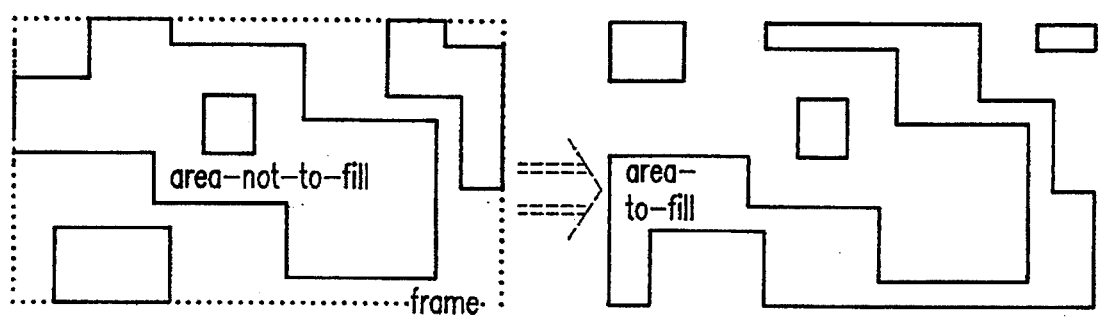
FIG. 5 is a geometric illustration of the results of computing areas-to-fill by complementing areas-not-to-fill.
Figure 6:
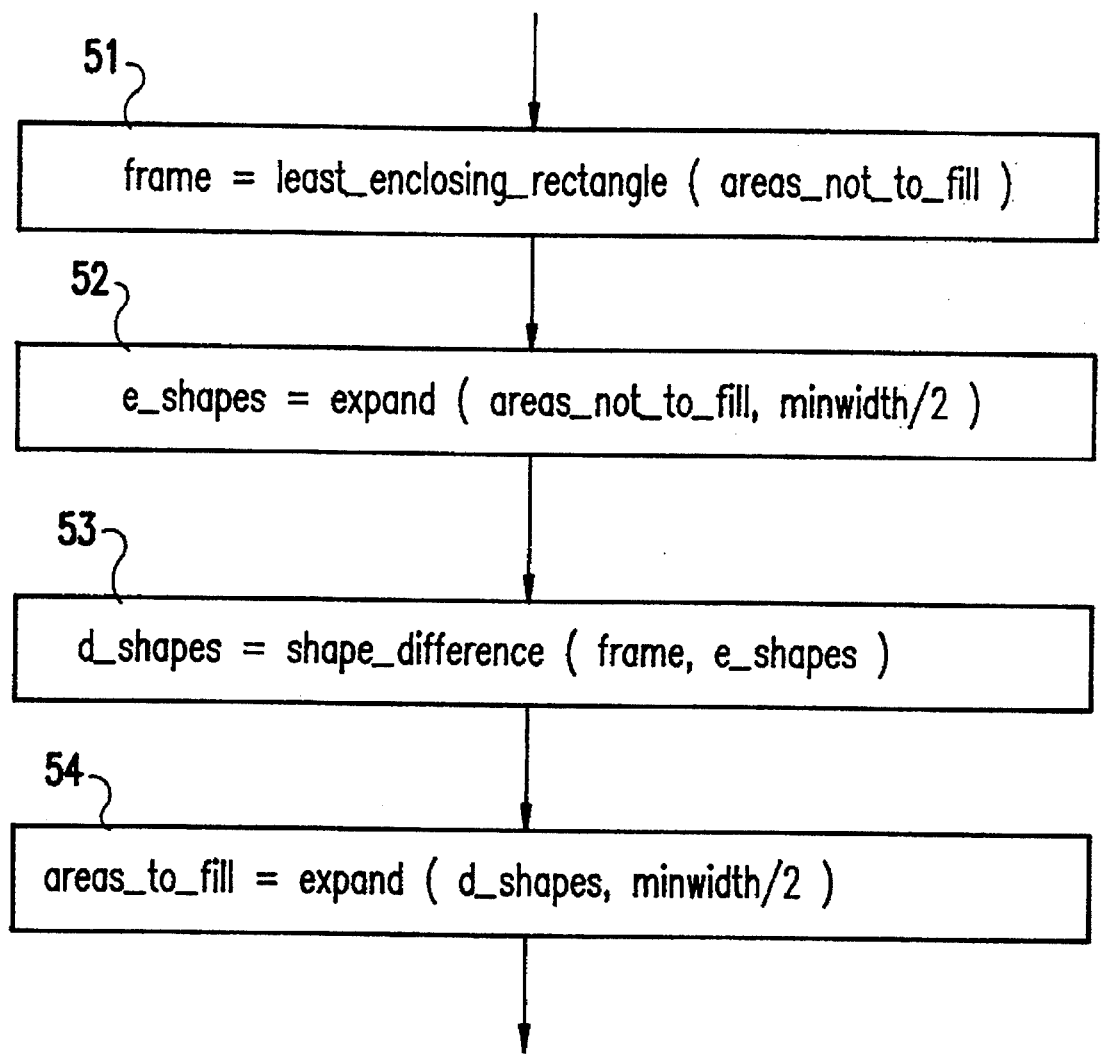
FIG. 6 is a flow diagram of the process for computing the "area-to-fill" using a "pre-expand/post-expand" process.

Next, the areas-to-fill is computed as the shape complement of the areas-not-to-fill previously computed, as illustrated for example in FIG. 5. We use the method for complementation shown in the flow diagram of FIG. 6, which generates the areas_to_fill and eliminates subminimum areas-to-fill. The first step 51 is to frame the areas_not_to_fill with a least enclosing rectangle (ler). Then in step 52, expanded shapes (e_shapes) are computed by expanding the areas_not_to_fill by half a minimum width (minwidth) of final areas_to_fill. Then, in step 53, shape differences (d_shapes) are computed as the shape_difference between the frames and the computed e_shapes. Finally, in step 54, the areas_to_fill is computed by expanding the d_shapes by half the minimum width.

In the preferred embodiment, steps 51 to 53 are performed using a Nested Complement Method described by Kim in application Ser. No. 08/445,436, referenced above. Briefly described, this method consists of an operation performed for each cell of the design in an order in which each cell i is processed before any cell j that uses cell i, directly or indirectly. The cellwise operation forms a framing shape and subtracts the native shapes of that cell and the framing shapes of all immediately-transformed cells, resulting in a cellwise complement. The cellwise complement is further processed by subtracting from it the expanded areas_not_to_fill (e_shapes). This approach has the effect of reducing computation time and maintaining the compact hierarchical structure of the partial result produced from the process in FIG. 6.

Having generated the areas-to-fill, we next populate those with a pattern having the following properties:

It has the same pattern density as the densest parts of the as-designed shapes on the polysilicon level.

It consists of small, non-connected shapes, in order to minimize electrical interference with other features passing over the fill shapes.

It satisfies ground rules for the fill shape level.

Figure 7:
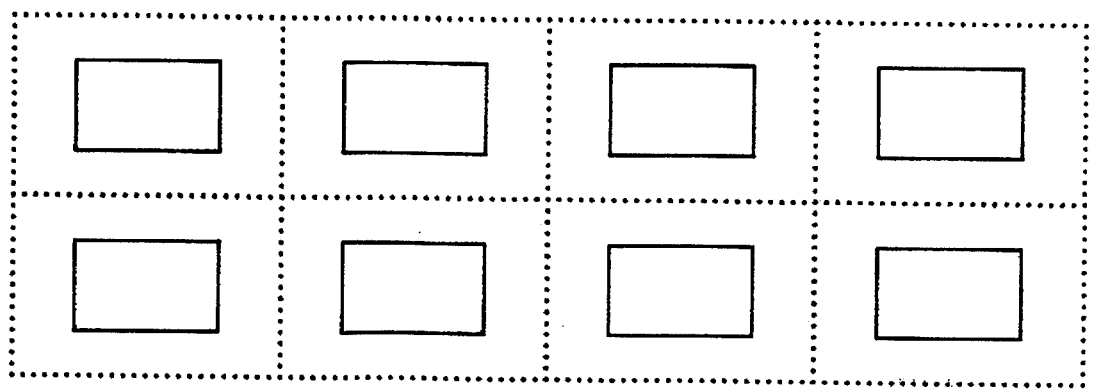
FIG. 7 is a block diagram illustrating an array of unit cells each consisting of a 2 µm×2 µm square in a 4 µm×4 µm frame.

It is convenient to compose the fill pattern from a regular array of unit cells. For example, if the pattern density is 25%, then the fill pattern could consist of an array of unit cells each consisting of a 2μm×2μm square in a 4μm×4μm frame, as shown in FIG. 7.

Figure 8:
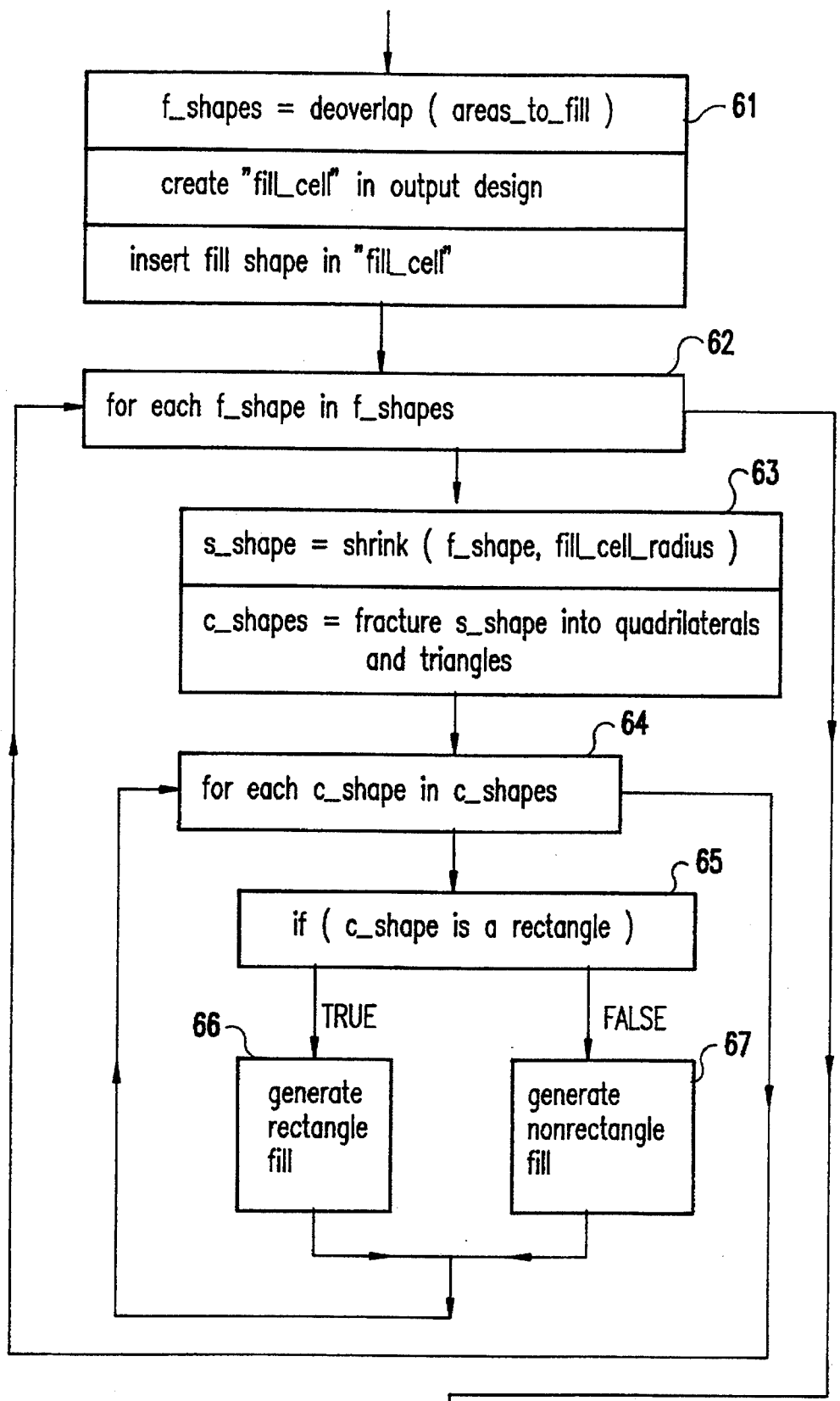
FIG. 8 is a flow diagram showing the details of the process of the "filling step"
Figure 9A:
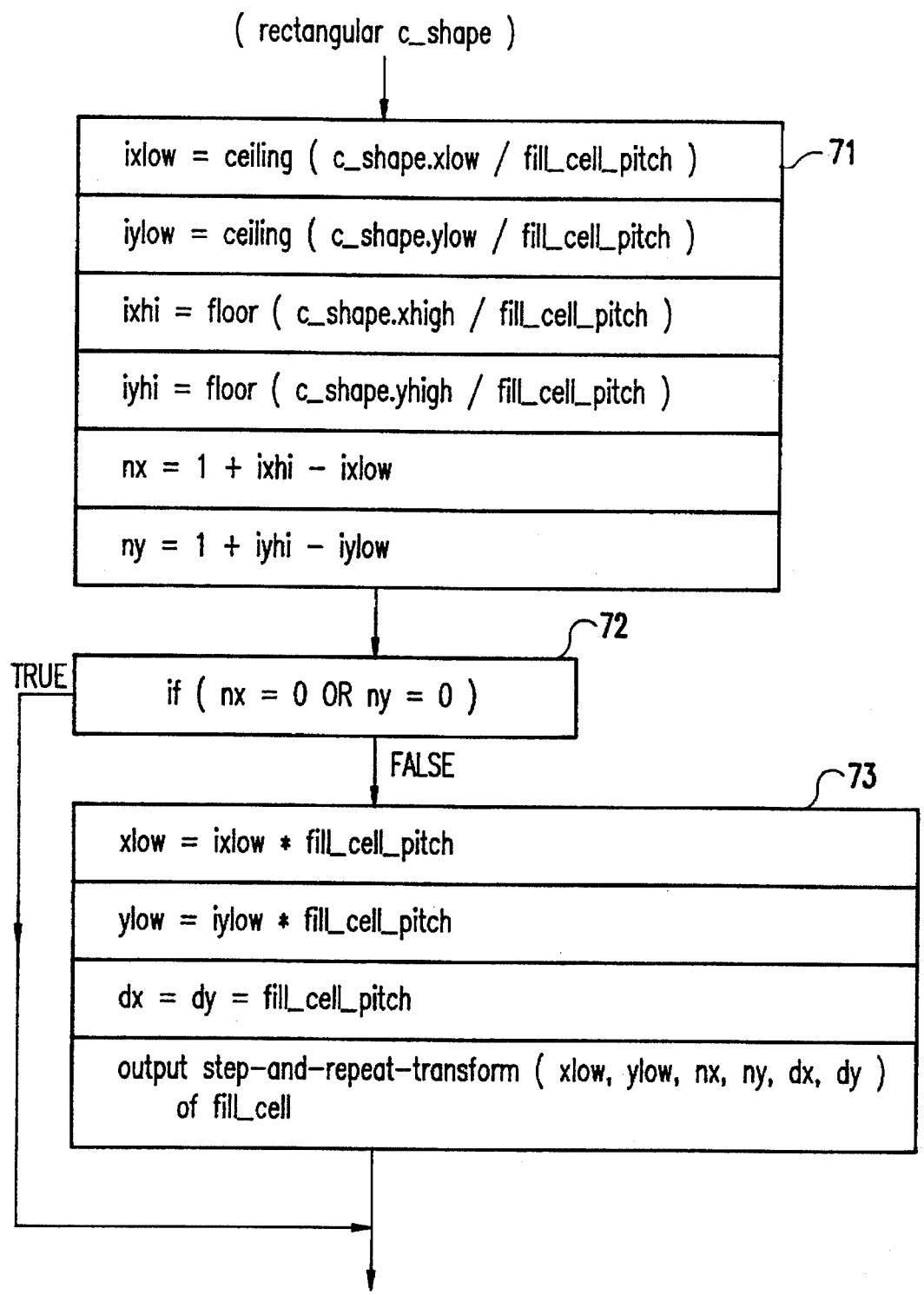
FIGS. 9A and 9B are respectively flow diagrams of the routines used in the process of FIG. 8 for generating rectangular fill and non-rectangular fill.
Figure 9B:
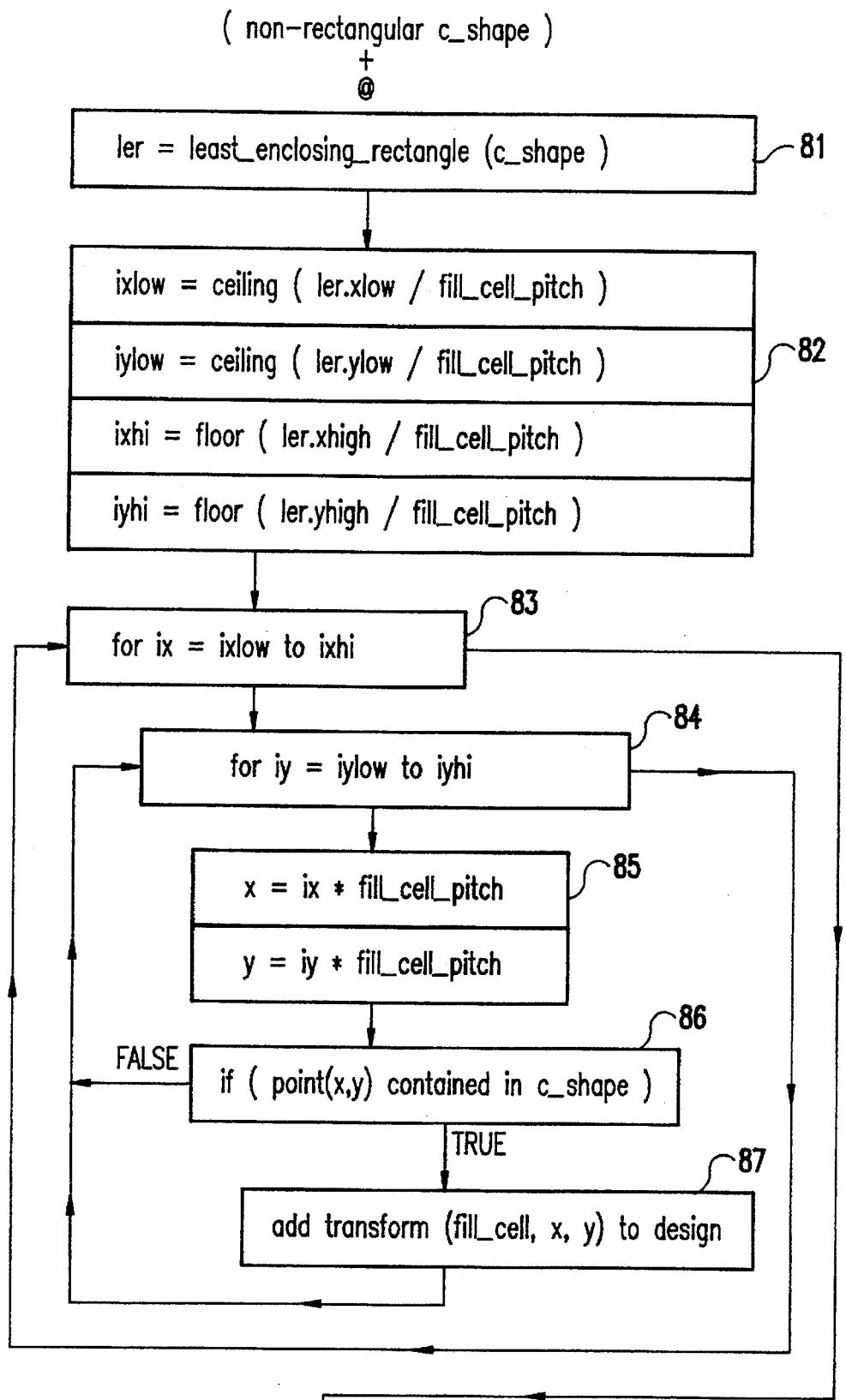

The "filling step" consists of the following steps and illustrated in the flow diagram of FIG. 8. In the first step 61, overlapping parts of shapes on the areas-to-fill level are removed. In the preferred implementation, the overlap-removal operation in step 61 is performed using the Shape Instance Method as taught by Weinert, Russell and Kim, supra. This has the effect of reducing computation time and maintaining the compact hierarchical structure of the partial result produced from the process in FIG. 4. For example, a series of sub-steps are performed beginning with computing fill shapes (f_shapes) by deoverlapping of the areas_to_fill. Next, a "fill cell" is created in the output design, and finally, the fill shape is inserted in the "fill_cell". Placements of this cell will be added to the design in subsequent steps to realize the fill pattern. In the next step 62, a loop is entered to process each of the computed f_shapes. In step 63, each of the resulting shapes is shrunk by half the diameter of the "unit cell" of the fill shapes (in the example described, this is 2 μms). This will insure that we do not place any part of the fill unit cell outside the bounds of the areas-to-fill pattern (4 μms in X and Y for the example shown in FIG. 7). In practice, this placement is done by enumerating the grid points in the X, Y range of the shrunken area-to-fill shape's bounding box. In the first sub-step, the shrink shapes (s_shapes) are computed by shrinking the fill shapes (f_shapes) by the fill_cell_radius (half the diameter of the "unit cell" of the fill shapes), and in the second sub-step, the shrink shapes are broken into geometric shapes (c_shapes). These are computed by fracturing the s_shapes into rectangles, quadrilaterals and triangles. In step 64, another loop is entered to process the computed c_shapes. In decision block 65 a determination is made as to whether the c_shape is a rectangle. If it is, the routine shown in the flow diagram of FIG. 9A is called in step 66; otherwise the routine shown in the flow diagram of FIG. 9B is called in step 67. When fill has been generated by either routine, the process loops back to step 64 to process the next c_shape. When all c_shapes have been processed, the process loops back to step 62 until all fill shapes (f_shapes) have been processed.

Figure 10:
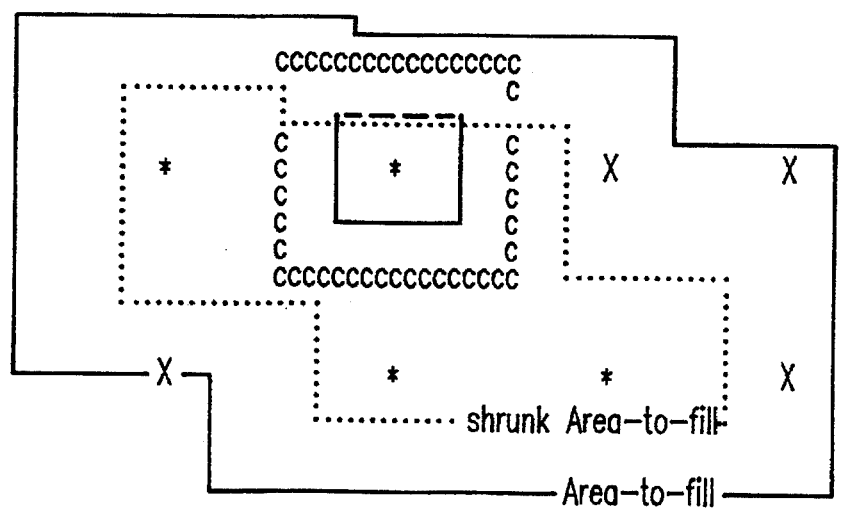
FIG. 10 is a geometric illustration of the case where the area-to-fill shape is a non-rectangle.

For the special case where the area-to-fill shape is a rectangle, the set of gird points is a rectangular subset of the infinite grid, say NROWS by NCOLS, illustrated by way of example in FIG. 10. In this case, a set of NROWS×NCOLS individual cell transforms representing the placements can be replaced by a single step-and-repeat transform or matrix copy of the unit cell with the specified pitch (e.g., 4 μms), X and Y counts (NROWS, NCOLS) and appropriate translation origin. This special case handling of rectangles-to-fill results in considerable savings in output storage size and execution time in subsequent manipulation of these data (e.g., mask-fracturing).

FIG. 9A shows the process of generating a rectangle fill. In step 71 the rectangular c_shape is input. In the first sub-step, ixlow is computed as the ceiling of c_shape.xlow divided by fill_cell_pitch. In the next sub-step, iylow is computed as the ceiling of c_shape.ylow divided by fill_cell_pitch. In the next sub-step, ixhi is computed as the floor of c_shape.xhigh divided by fill_cell_pitch, and in the final sub-step, iyhi is computed as the floor of c_shape.yhigh divided by fill_cell_pitch. nx is computed as 1+ixhi−ixlow, and ny is computed as 1+iyhi−iylow. A test is then made in decision block 72 to determine if either nx or ny are zero. If not, the process goes to step 73; otherwise, the routine exits. There are several sub-steps in step 73. The first sub-step computes xlow as the product of ixlow times fill_cell_pitch. The next sub-step computes ylow as the product of iylow times fill_cell_pitch. In the next sub-step, the differentials dx and dy are set to fill_cell_pitch. The last sub-step is to output a step-and-repeat-transform using xlow, ylow, nx, ny, dx, and dy of the fill cell.

The process of generating a non-rectangular fill is shown in FIG. 9B and is a bit more complex than the special case of generating the rectangular fill. The non-rectangular c_shape is input to function block 81 where a least_enclosing_rectangle (ler) for the c_shape is first generated. This least enclosing rectangle (ler) shape is input to step 82 which comprises a series of substeps. In the first sub-step, ixlow is computed as the ceiling of ler.xlow divided by fill_cell_pitch. In the next sub-step, iylow is computed as the ceiling of ler.ylow divided by fill_cell_pitch. In the next sub-step, ixhi is computed as the floor of ler.xhigh divided by fill_cell_pitch, followed by the next sub-step where iyhi is computed as the floor of ler.yhigh divided by fill_cell_pitch. At this point, the process enters a pair of nested loops at steps 83 and 84 to process each ix from ixlow to ixhi and iy from iylow to iyhi. In step 85, x is computed as the product of ix times fill_cell_pitch and y is computed as the product of iy times fill_cell_pitch. A test is made in decision block 86 to determine if point (x,y) is contained in the c_shape being processed. If not, the process loops back to step 84 to process the next iy, and when all iys have been processed the process loops back to step 83 to process the next ix until all ixs have been processed, at which point the routine exits. If the point (x, y) is in the c_shape being processed, the transform (fill_cell, x, y) is added to the design in function block 87.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A computer-implemented method for modifying an integrated circuit chip or package design by adding fill shapes to the design comprising the steps of:

inputting an original design as a data file;

for each level of the original design, generating an area-not-to-fill as a function of set backs from features of the original design;

computing an areas-not-to-fill as a union of generated area-not-to-fill for all levels;

operating on the computed areas-not-to-fill to generate a complement as areas-to-fill and eliminating portions of the areas-to-fill that are narrower than a fill pattern unit cell;

breaking remaining areas-to-fill into geometric shapes;

populating resulting geometric shapes with a fill pattern comprised of multiple placements of the fill pattern unit cell; and combining the generated fill shapes with the original design to make local pattern density more uniform and reduce process-induced variations in feature size and shape.

2. The computer-implemented method for modifying an integrated circuit chip or package design recited in claim 1 wherein the geometric shapes are rectangles, quadrilaterals and triangles.

3. The computer-implemented method for modifying an integrated circuit chip or package design recited in claim 1 further comprising the step of determining placements of the fill pattern unit cell by generating a repetitive array of unit cells and selecting those completely covered by the areas-to-fill.

4. The computer-implemented method for modifying an integrated circuit chip or package design recited in claim 1 further comprising the steps of:

determining placements of the fill pattern unit cell by shrinking the areas-to-be-filled;

determining which of an infinite regular array of grid points fall in the areas-to-be-filled; and generating a placement for each point.

5. The computer-implemented method for modifying an integrated circuit chip or package design recited in claim 1 further comprising the steps of:

determining placements of the fill pattern unit cell by shrinking the rectangular area-to-be-filled;

determining a rectangular subset of an infinite regular array of grid points that fall in the areas- to-be-filled; and generating a step-and-repeat placement of the fill pattern unit cell corresponding to that rectangular subset.

6. A programmed computer system for modifying an integrated circuit chip or package design represented by a data file, comprising:

generating means for accessing said data file and, for each level of an original design, generating an area-not-to-fill as a function of set backs from features of the original design;

computing means responsive each area-not-to-fill generated by said generating means for computing an areas-not-to-fill as a union of all generated area-not-to-fill, said computing means then complementing the computed areas-not-to-fill to generate a complement as an areas-to-fill;

comparison means for eliminating portions of the areas-to-fill that are narrower than a fib pattern unit cell;

geometric means for breaking remaining areas-to-fill into geometric shapes and populating resulting geometric shapes with a fill pattern comprised of multiple placements of the fill pattern unit cell; and combining means for combining the generated fill shapes with the original design to make local pattern density more uniform and reduce process-induced variations in feature size and shape.

\* \* \* \* \*